United States Patent
Chiou et al.

(10) Patent No.: US 8,264,077 B2
(45) Date of Patent: Sep. 11, 2012

(54) BACKSIDE METAL OF REDISTRIBUTION LINE WITH SILICIDE LAYER ON THROUGH-SILICON VIA OF SEMICONDUCTOR CHIPS

(75) Inventors: Wen-Chih Chiou, Miaoli (TW); Weng-Jin Wu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 356 days.

(21) Appl. No.: 12/345,239

(22) Filed: Dec. 29, 2008

(65) Prior Publication Data

US 2010/0164109 A1    Jul. 1, 2010

(51) Int. Cl.
*H01L 23/04* (2006.01)

(52) U.S. Cl. ........ 257/698; 257/723; 257/730; 257/733; 257/E23.011; 438/667

(58) Field of Classification Search .................. 257/698, 257/723, 730, 733, E23.011; 438/667
See application file for complete search history.

(56) References Cited

U.S. PATENT DOCUMENTS

| | | | |
|---|---|---|---|
| 5,239,746 A * | 8/1993 | Goldman | 29/840 |
| 5,391,917 A | 2/1995 | Gilmour et al. | |
| 5,407,846 A * | 4/1995 | Chan | 438/156 |
| 5,510,298 A | 4/1996 | Redwine | |
| 5,767,001 A | 6/1998 | Bertagnolli et al. | |
| 5,998,292 A | 12/1999 | Black et al. | |
| 6,184,060 B1 | 2/2001 | Siniaguine | |
| 6,322,903 B1 | 11/2001 | Siniaguine et al. | |
| 6,448,168 B1 | 9/2002 | Rao et al. | |
| 6,465,892 B1 | 10/2002 | Suga | |
| 6,472,293 B1 | 10/2002 | Suga | |
| 6,538,333 B2 | 3/2003 | Kong | |
| 6,599,778 B2 | 7/2003 | Pogge et al. | |
| 6,639,303 B2 | 10/2003 | Siniaguine | |
| 6,664,129 B2 | 12/2003 | Siniaguine | |
| 6,675,469 B1 * | 1/2004 | Haba et al. | 29/830 |
| 6,693,361 B1 | 2/2004 | Siniaguine et al. | |
| 6,740,582 B2 | 5/2004 | Siniaguine | |
| 6,800,930 B2 | 10/2004 | Jackson et al. | |
| 6,841,883 B1 | 1/2005 | Farnworth et al. | |
| 6,882,030 B2 | 4/2005 | Siniaguine | |
| 6,897,125 B2 | 5/2005 | Morrow et al. | |
| 6,924,551 B2 | 8/2005 | Rumer et al. | |
| 6,962,867 B2 | 11/2005 | Jackson et al. | |
| 6,962,872 B2 | 11/2005 | Chudzik et al. | |
| 7,030,481 B2 | 4/2006 | Chudzik et al. | |
| 7,049,170 B2 | 5/2006 | Savastiouk et al. | |
| 7,060,601 B2 | 6/2006 | Savastiouk et al. | |
| 7,071,546 B2 | 7/2006 | Fey et al. | |

(Continued)

OTHER PUBLICATIONS

Shen, L.-C., et al., "A Clamped Through Silicon Via (TSV) Interconnection for Stacked Chip Bonding Using Metal Cap on Pad and Metal Column Forming in Via," 2008, pp. 544-549, Electronic Components and Technology Conference, IEEE.

*Primary Examiner* — Thanh V Pham
(74) *Attorney, Agent, or Firm* — Slater & Matsil, L.L.P.

(57) ABSTRACT

An integrated circuit structure includes a semiconductor substrate having a front side and a backside. A through-silicon via (TSV) penetrates the semiconductor substrate. The TSV has a back end extending to the backside of the semiconductor substrate. A redistribution line (RDL) is over the backside of the semiconductor substrate and connected to the back end of the TSV. A silicide layer is over and contacting the RDL.

16 Claims, 9 Drawing Sheets

U.S. PATENT DOCUMENTS

| | | |
|---|---|---|
| 7,111,149 B2 | 9/2006 | Eilert |
| 7,122,912 B2 | 10/2006 | Matsui |
| 7,157,787 B2 | 1/2007 | Kim et al. |
| 7,193,308 B2 | 3/2007 | Matsui |
| 7,262,495 B2 | 8/2007 | Chen et al. |
| 7,297,574 B2 | 11/2007 | Thomas et al. |
| 7,335,592 B2 * | 2/2008 | Kim et al. ............ 438/667 |
| 7,335,972 B2 | 2/2008 | Chanchani |
| 7,355,273 B2 | 4/2008 | Jackson et al. |
| 7,435,620 B2 * | 10/2008 | Benson et al. ............ 438/108 |
| 7,605,080 B2 * | 10/2009 | Koizumi et al. ............ 438/667 |
| 7,936,052 B2 * | 5/2011 | Barth et al. ............ 257/659 |
| 2005/0186339 A1 * | 8/2005 | Rajagopalan et al. ..... 427/248.1 |
| 2008/0079121 A1 | 4/2008 | Han |
| 2009/0321947 A1 * | 12/2009 | Pratt ............ 257/777 |

* cited by examiner

US 8,264,077 B2

BACKSIDE METAL OF REDISTRIBUTION LINE WITH SILICIDE LAYER ON THROUGH-SILICON VIA OF SEMICONDUCTOR CHIPS

TECHNICAL FIELD

This invention relates generally to integrated circuit structures, and more particularly to through-silicon vias, and even more particularly to the formation of backside metals that are connected to the through-silicon vias.

BACKGROUND

Since the invention of integrated circuits, the semiconductor industry has experienced continuous rapid growth due to constant improvements in the integration density of various electronic components (i.e., transistors, diodes, resistors, capacitors, etc.). For the most part, this improvement in integration density has come from repeated reductions in minimum feature size, allowing more components to be integrated into a given chip area.

These integration improvements are essentially two-dimensional (2D) in nature, in that the volume occupied by the integrated components is essentially on the surface of the semiconductor wafer. Although dramatic improvements in lithography have resulted in considerable improvements in 2D integrated circuit formation, there are physical limitations to the density that can be achieved in two dimensions. One of these limitations is the minimum size needed to make these components. Also, when more devices are put into one chip, more complex designs are required.

An additional limitation comes from the significant increase in the number and lengths of interconnections between devices as the number of devices increases. When the number and the lengths of interconnections increase, both circuit RC delay and power consumption increase.

Among the efforts for resolving the above-discussed limitations, three-dimensional integrated circuits (3DICs) and stacked dies are commonly used. Through-silicon vias (TSVs) are thus used in the 3DICs and the stacked dies for connecting dies. In this case, TSVs are often used to connect the integrated circuits on a die to the backside of the die. In addition, TSVs are also used to provide short grounding paths for grounding the integrated circuits through the backside of the die, which may be covered by a grounded metallic film.

FIG. 1 illustrates a conventional TSV 102 formed in chip 104. TSV 102 is in silicon substrate 106. Through the interconnections (metal lines and vias, not shown) in the metallization layers, TSV 102 is electrically connected to bond pad 110 and metal post 108 on bond pad 110, wherein bond pad 110 is on the front surface of chip 104. TSV 102 is exposed through the back surface of substrate 106 in the form of a copper post. When chip 104 is bonded to another chip, TSV 102 is bonded to a bond pad on the other chip, with or without solder therebetween. This scheme suffers from drawbacks. Since the TSV bonding requires relatively large pitch between TSVs, the locations of the TSVs are restricted and the distances between the TSVs need to be big enough to allow room for, for example, solder balls. Otherwise, there may be joint failure since the neighboring solder balls may touch each other. New backside structures are thus needed.

SUMMARY OF THE INVENTION

In accordance with one embodiment of the present invention, an integrated circuit structure includes a semiconductor substrate having a front side and a backside. A through-silicon via (TSV) penetrates the semiconductor substrate. The TSV has a back end extending to the backside of the semiconductor substrate. A redistribution line (RDL) is over the backside of the semiconductor substrate and connected to the back end of the TSV. A silicide layer is over and contacting the RDL.

In accordance with another embodiment of the present invention, an integrated circuit structure includes a semiconductor substrate having a front side and a backside. A TSV penetrates the semiconductor substrate, and has a back end extending beyond the backside of the semiconductor substrate. An RDL is over the backside of the semiconductor substrate and connected to the back end of the TSV, wherein the RDL includes copper. A silicide layer is over and adjoining the RDL, wherein the silicide layer includes copper silicide. A passivation layer is over and adjoining the RDL with an opening in the passivation layer and the silicide layer, wherein a portion of the RDL is exposed through the opening. A metal finish is in the opening and contacts the RDL.

The advantageous features of the present invention include improved bond ability and improved reliability of backside structures due to reduced oxidation of the RDLs.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the present invention are discussed in detail below. It should be appreciated, however, that the embodiments of the present invention provide many applicable inventive concepts that can be embodied in a wide variety of specific contexts. The specific embodiments discussed are merely illustrative of specific ways to make and use the invention, and do not limit the scope of the invention.

A novel backside connection structure connected to a through-silicon vias (TSVs) and methods of forming the same are provided. The intermediate stages of manufacturing an embodiment of the present invention are illustrated. The variations of the embodiment are discussed. Throughout the various views and illustrative embodiments of the present invention, like reference numbers are used to designate like elements.

Figure 1:
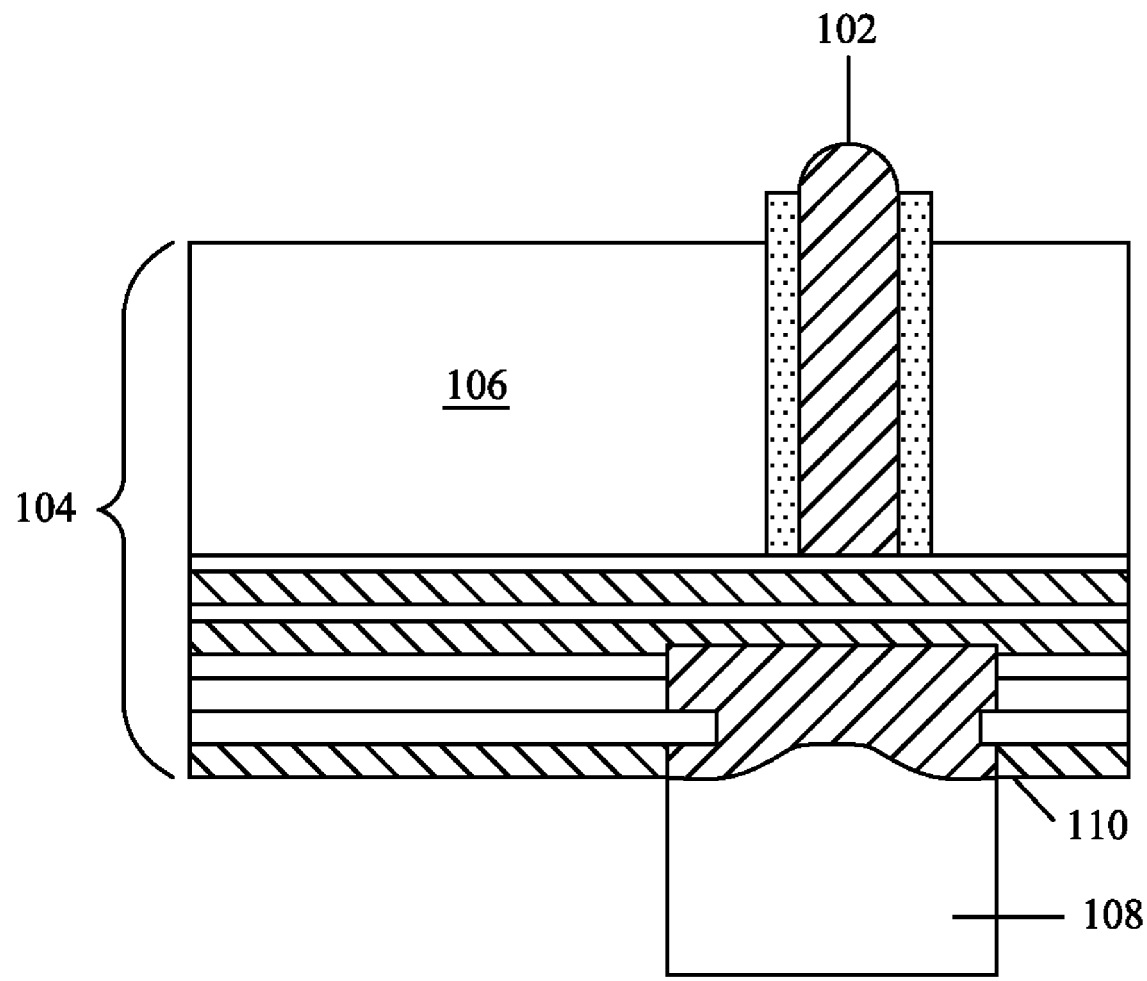
FIG. 1 illustrates a conventional integrated circuit structure including a through-silicon via (TSV), wherein the TSV protrudes through the backside of a substrate, and is bonded to a bond pad on another chip in the form of a copper post.
Figure 2:
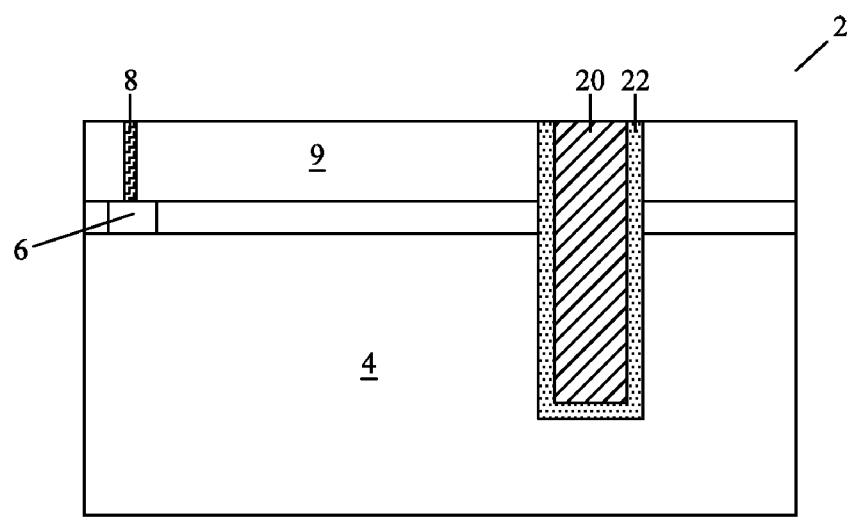
FIGS. 2 through 12C are cross-sectional views of intermediate stages in the manufacturing of an embodiment of the present invention.

Referring to FIG. 2, chip 2, which includes substrate 4 and active circuit 6 therein, is provided. Substrate 4 may be a semiconductor substrate, such as a bulk silicon substrate, although it may include other semiconductor materials including group III, group IV, and/or group V elements. Active devices that are in active circuit 6, such as transistors, may be formed at the front surface (the surface facing up in FIG. 2) of substrate 4. Inter-layer dielectric (ILD) 9 is formed over substrate 4 and active circuit 6. Contact plug 8 is formed in ILD 9 and connected to active circuit 6.

After the formation of ILD 9 and contact plug 8, TSV 20 is formed in substrate 4, and extends from the top surface of ILD 9 into substrate 4. In an embodiment, as is shown in FIG. 2, TSV 20 is formed using a via-first approach, and is formed before the formation of interconnect structure 12 (not shown in FIG. 2, please refer to FIG. 3). Accordingly, TSV 20 only extends to ILD 9, but not into the inter-metal dielectrics (IMDs) in the subsequently formed interconnect structure 12. In alternative embodiments, TSV 20 may be formed using a via-last approach, and is formed after the formation of interconnect structure 12. Accordingly, TSV 20 will penetrate through both substrate 4 and interconnect structure 12. Isolation layer 22 is formed on the sidewalls of TSV 20, and electrically insulates TSV 20 from substrate 4. Isolation layer 22 may be formed of commonly used dielectric materials such as silicon nitride, silicon oxide (for example, tetra-ethyl-ortho-silicate (TEOS) oxide), and/or the like.

Figure 3:
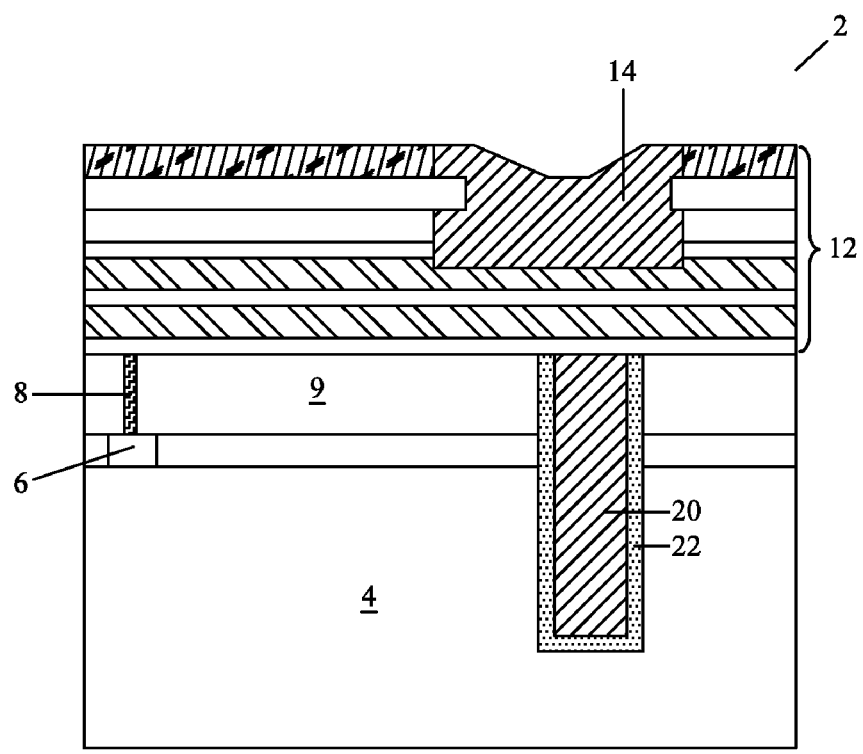

Referring to FIG. 3, interconnect structure 12, which includes metal lines and vias (not shown) formed therein, is formed over substrate 4 and connected to the active devices. The metal lines and vias may be formed of copper or copper alloys, and may be formed using well-known damascene processes. Interconnect structure 12 may include commonly known IMDs. Bond pad 14 is formed on the front side (the side facing up in FIG. 2) of, and may or may not protrude beyond, the front surface of chip 2. Bond pad 14 may also be connected to the active devices through the metal lines and vias in interconnect structure 12.

Figure 4:
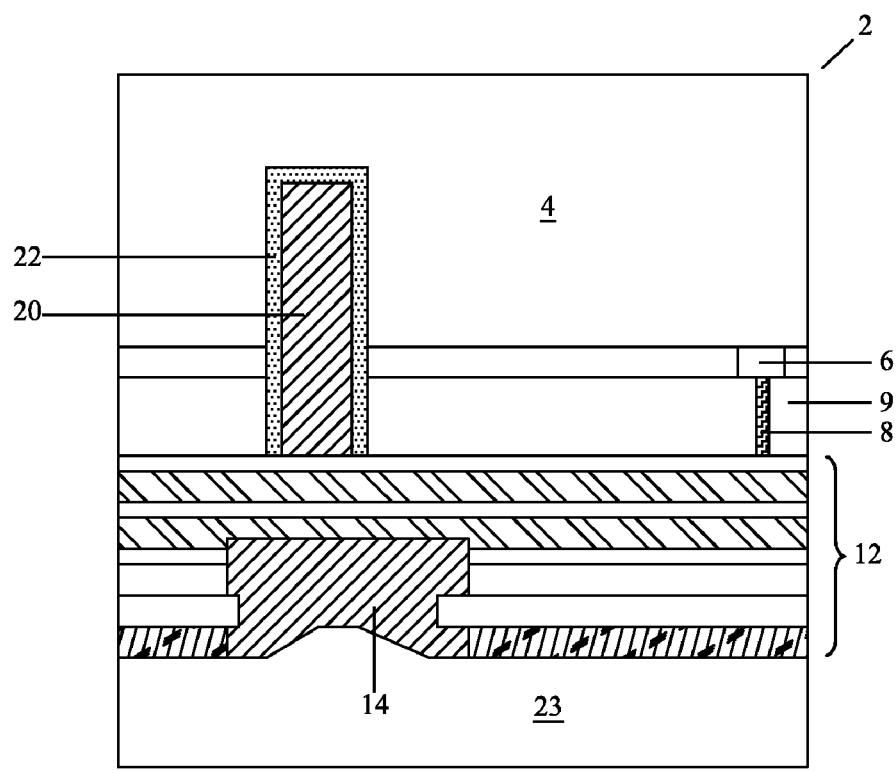
Figure 5:
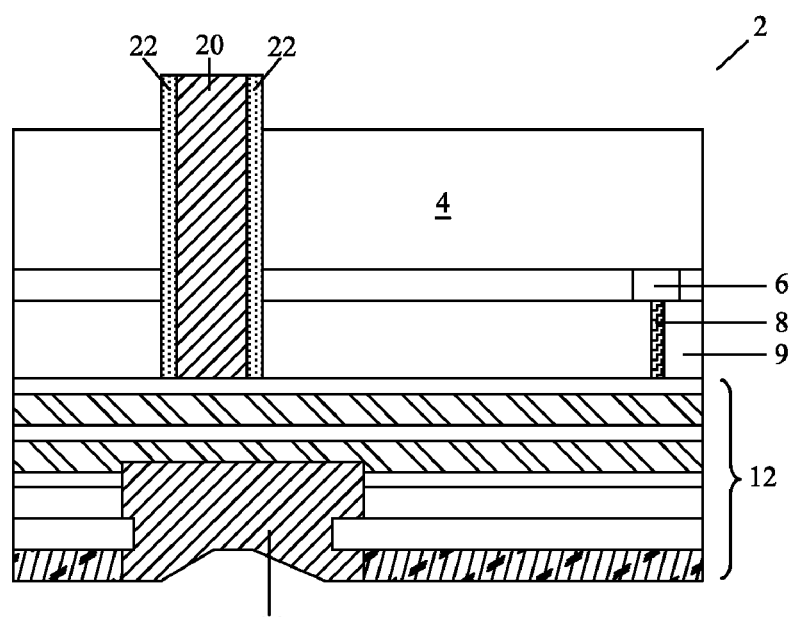
Figure 6:
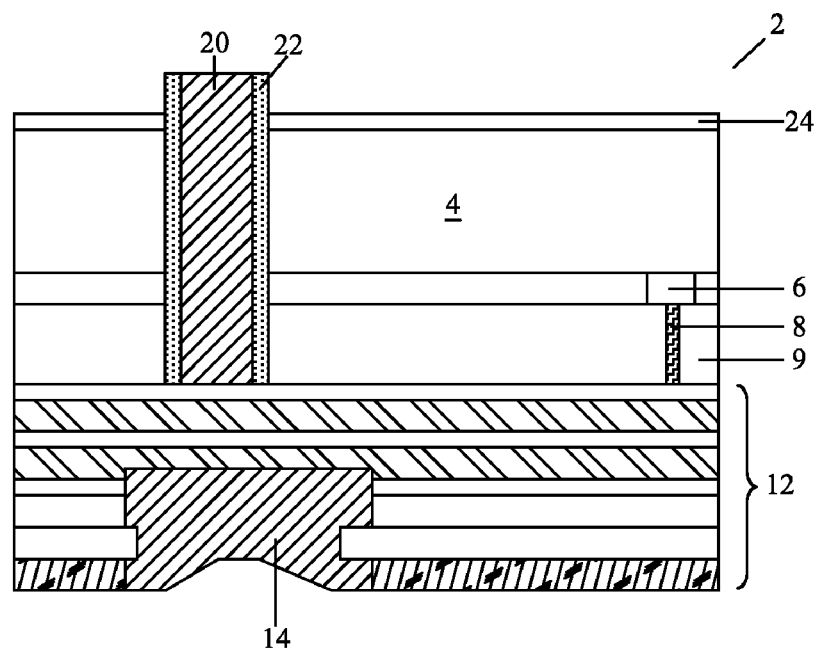

Referring to FIG. 4, tape 23 (or a glass wafer) is attached to the front side of chip 2 (or the respective wafer in which chip 2 is located), and chip 2 is ground and polished to remove excess portions, until TSV 20 is exposed through the back surface of substrate 4, as shown in FIG. 5. The back surface of substrate 4 may also be etched to remove the layer damaged in the grinding and polishing processes. In FIG. 6, backside passivation layer 24 is formed covering the backside of substrate 4. Backside passivation layer 24 may be formed of commonly used dielectric materials such as silicon nitride, silicon oxide (for example, tetra-ethyl-ortho-silicate (TEOS) oxide), silicon oxynitride, silicon carbide, silicon carbo-oxynitride, or the like. In an exemplary embodiment, the formation of backside passivation layer 24 includes blanket forming backside passivation layer 24, lightly performing a chemical mechanical polish to remove the portion of backside passivation layer 24 directly over TSV 20, and possibly performing an etching to reduce the thickness of backside passivation layer 24. In alternative embodiments, the opening in backside passivation layer 24, through which TSV 20 is exposed, is formed by etching.

Figure 7:
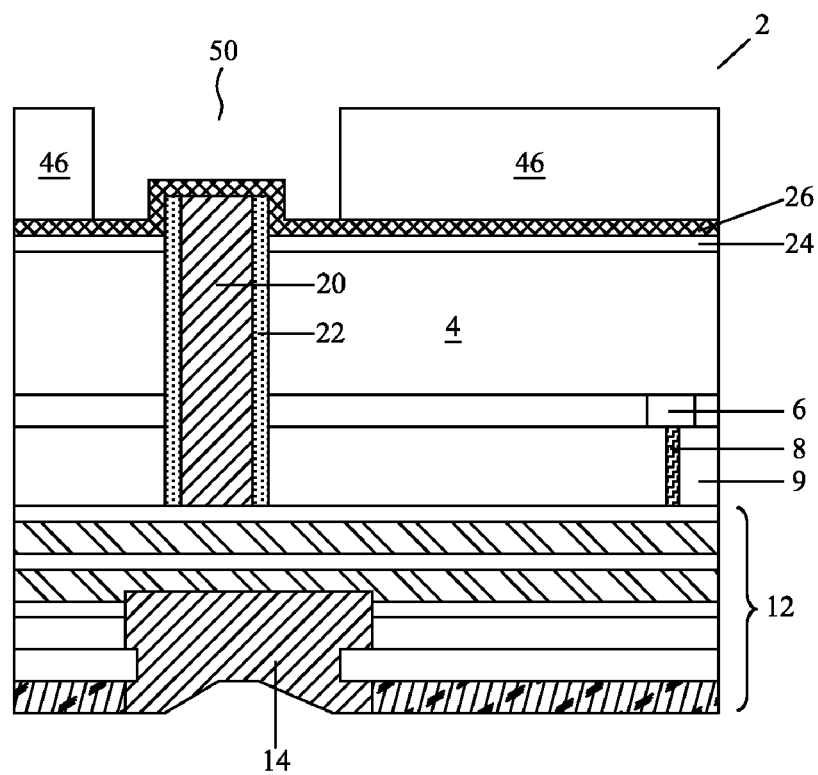

Referring to FIG. 7, a thin seed layer 26, also referred to as an under-bump metallurgy (UBM), is blanket formed on backside passivation layer 24 and TSV 20. The usable materials of UBM 26 include copper or copper alloys. However, other metals, such as titanium, silver, gold, aluminum, and combinations thereof, may also be included. In an embodiment, UBM 26 is formed using sputtering. In other embodiments, physical vapor deposition (PVD) or electro plating may be used.

FIG. 7 also illustrates the formation of mask 46. In an embodiment, mask 46 is a dry film, which may include an organic material such as Ajinimoto buildup film (ABF), Prepreg, or the like. Alternatively, mask 46 is formed of photoresist. Mask 46 is then patterned to form opening 50 in mask 46, with TSV 20 and the corresponding overlying portion of UBM 26 being exposed through opening 50.

Figure 8:
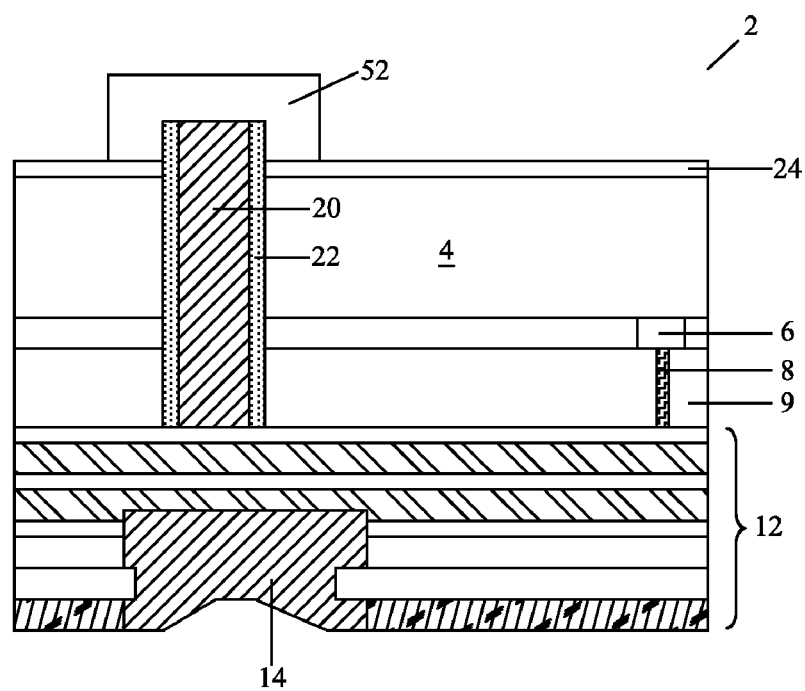

In FIG. 8, opening 50 is selectively filled with a metallic material, forming redistribution line (RDL) 52 in opening 50. In an embodiment, the filling material includes copper or copper alloys, although other metals, such as aluminum, silver, gold, and combinations thereof, may also be used. The formation methods preferably include electro-chemical plating (ECP), electroless plating, or other commonly used deposition methods such as sputtering, printing, and chemical vapor deposition (CVD) methods. Mask 46 is then removed. As a result, the portions of UBM 26 underlying mask 46 are exposed.

Again as shown in FIG. 8, the exposed portions of UBM 26 are removed by a flash etching. The remaining RDL 52 may include an RDL strip (also referred to as a redistribution trace) that includes a portion directly over, and/or connected to, TSV 20, and optionally an RDL pad joining the RDL strip, wherein the RDL pad is laterally spaced apart from TSV 20 and has a greater width than the RDL strip. The RDL pad may not be directly over TSV 20. In FIG. 8 and subsequent figures, the remaining portion of UBM 26 is not shown since it is typically formed of similar materials as RDL 52, and thus it appears to be merged with RDL 52. As a result of the flash etching, a thin layer of RDL 52 is also removed. However, the removed portion of RDL 52 is negligible compared to its overall thickness.

Figure 9:
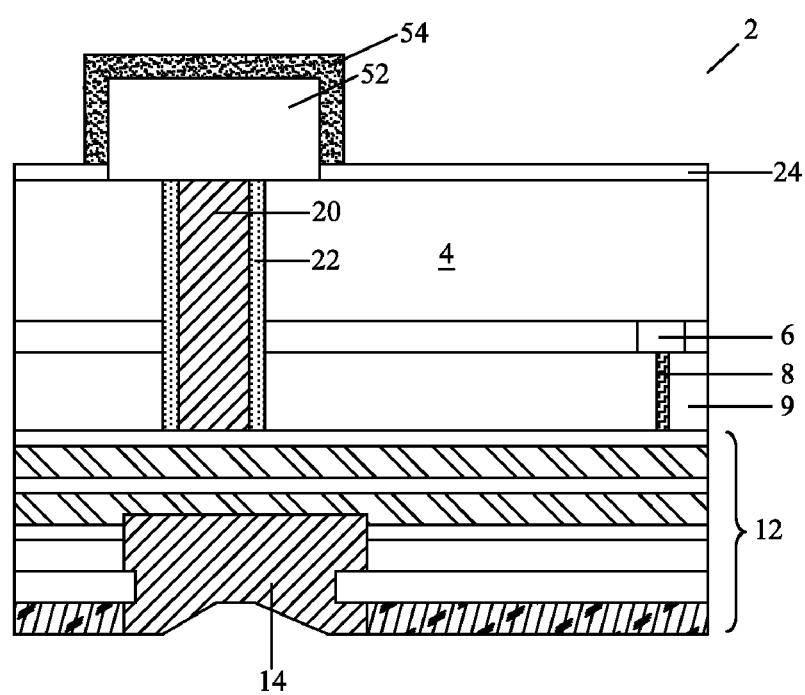

FIG. 9 illustrates the formation of silicide layer 54 covering RDL 52. In an embodiment, silicide layer 54 is formed by treating the structure as shown in FIG. 8 in an environment filled with a silicon-containing precursor, such as silane ($SiH_4$), although other similar precursors may also be used. The treatment may be a plasma treatment or a thermal treatment, with a temperature between about 100° C. and about 400° C. As a result of the treatment, at least the exposed surface of RDL 52 is silicided, forming silicide layer 54. The thickness of silicide layer 54 may be between several angstroms and about 100 Å, although it may also be thicker or thinner. When RDL 52 is formed of copper or copper alloys, silicide layer 54 includes copper silicide. Silicide layer 54 includes a portion directly over RDL 52, and portions on all sidewalls of RDL 52.

Figure 10:
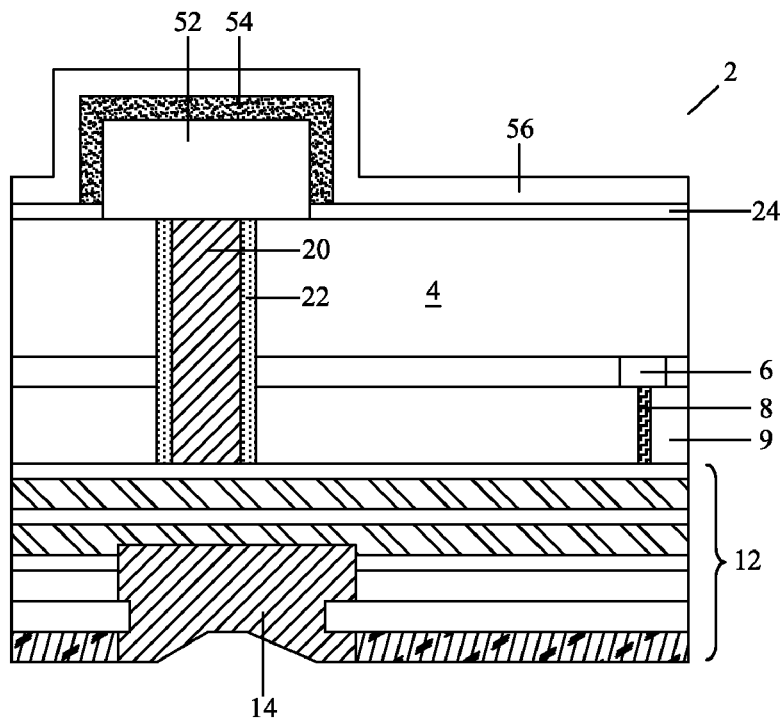

Next, as shown in FIG. 10, passivation layer 56 is blanket formed. Passivation layer 56 may be formed of nitrides, oxides, polyimide, and/or the like. Since the formation of passivation layer 56 may require oxygen-containing precursors, by forming silicide layer 54 to cover RDL 52 before the formation of passivation layer 56, the possible oxidation and damage to RDL 52 caused by the formation of passivation layer 56 is avoided. Advantageously, a non-oxidized RDL has a better joint with the subsequently applied materials formed on RDL 52, such as metal finishes.

Figure 11A:
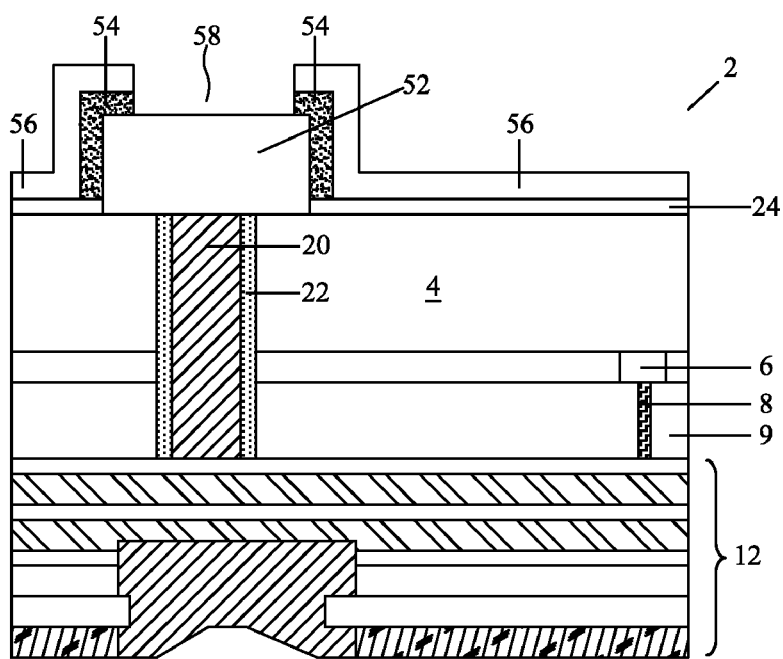

In FIG. 11A, passivation layer 56 is patterned to form opening 58. A portion of RDL 52, for example, the RDL pad portion, is exposed through opening 58. Opening 58 may be directly over a center portion of the RDL pad in RDL 52. In an embodiment, opening 58 penetrates silicide layer 54, so that the underlying RDL 52 is exposed. In alternative embodiments, the exposed portion of silicide layer 54 is not removed during the formation of opening 58, as is shown in FIG. 11B, and will be in physical contact with the subsequently formed metal finish.

Figure 12A:
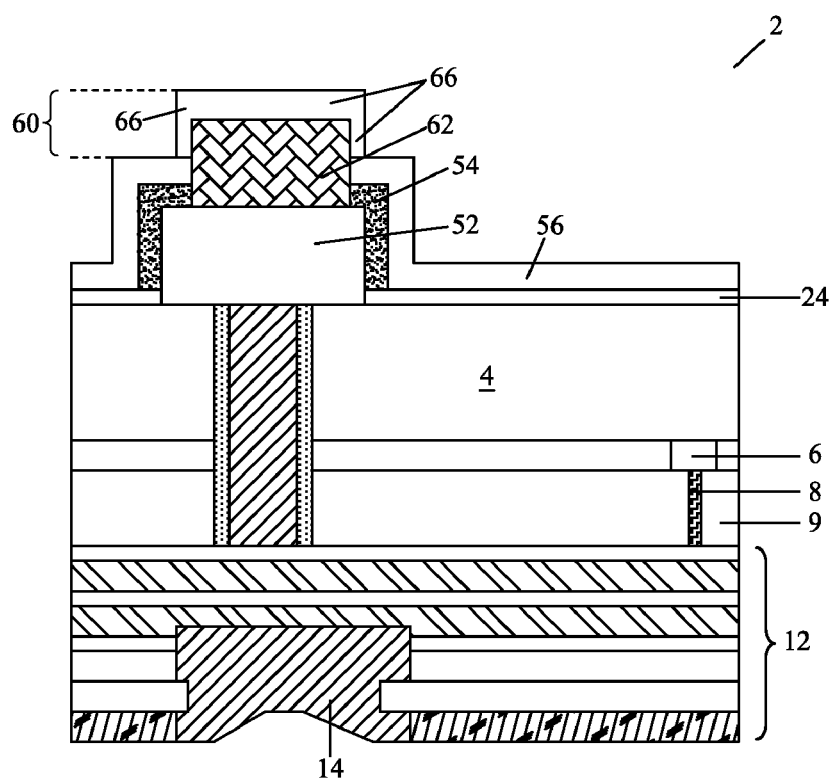

Next, as shown in FIG. 12A, metal finish 60 is formed, which extends into opening 58. The formation methods of metal finish 60 include ECP, electroless plating, and the like. In an embodiment, metal finish 60 includes nickel layer 62 directly on, and contacting, RDL 52. Optionally, additional layers, such as gold layer 66, or gold layer 66 on a palladium layer (not shown), may be formed on nickel layer 62. The thickness of nickel layer 62 is greater than the thickness of passivation layer 56, so that the top surface of nickel layer 62 is higher than the top surface of passivation layer 56.

Figure 11B:
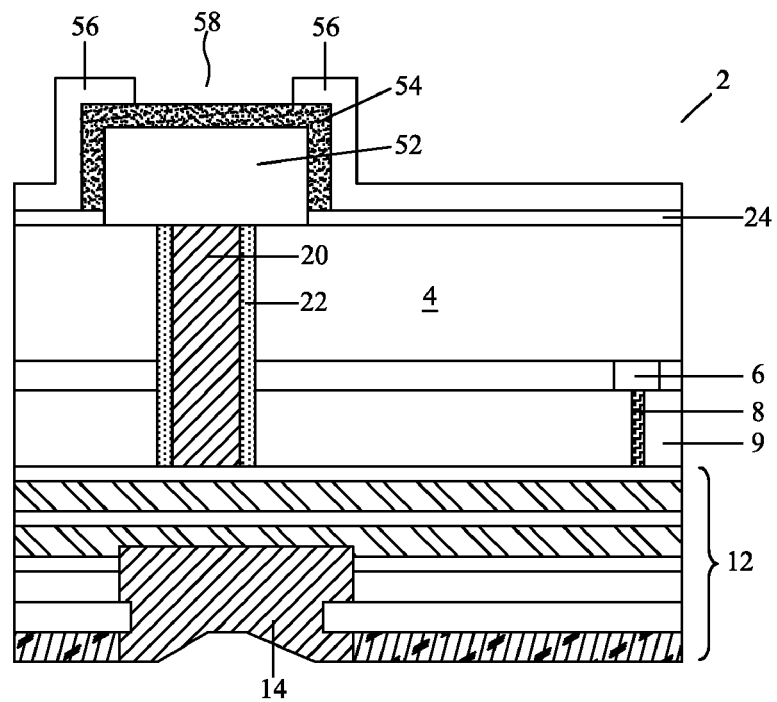
Figure 12B:
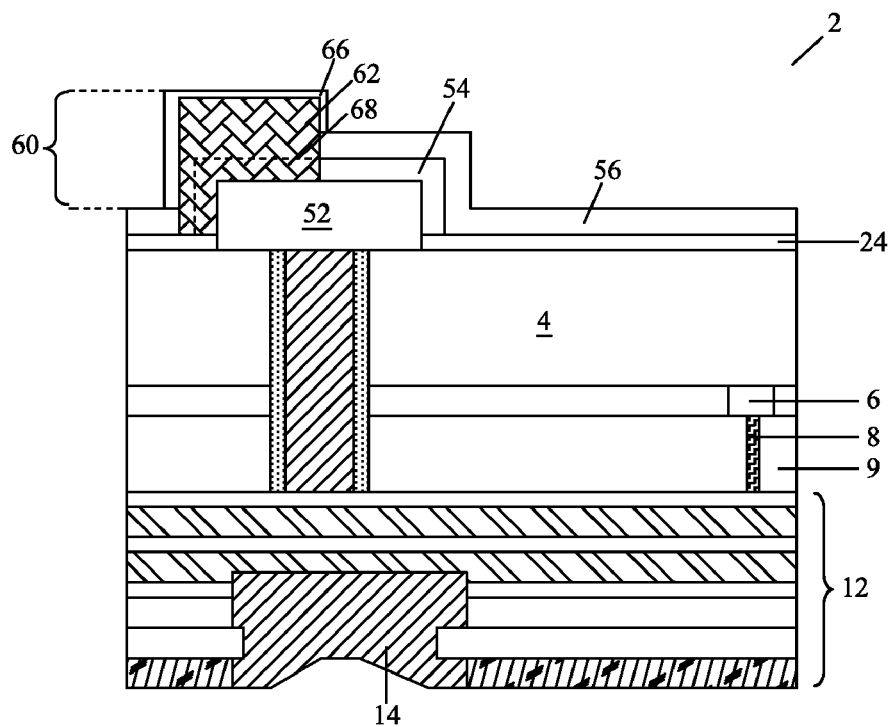

In an alternative embodiment, as shown in FIG. 12B, in addition to the top surface of RDL 52, one or more sidewalls of RDL 52 is also exposed during the step of forming opening 58 (refer to FIGS. 11A and 11B). Accordingly, metal finish 60, in addition to contacting the top surface, may also contact the sidewall of RDL 52 (if silicide layer 54 is etched). In alternative embodiments, as indicated by the dotted line 68, the portion of silicide layer 54 exposed through opening 58 is not removed, and hence metal finish 60 also contacts the sidewall portion of silicide layer 54.

Figure 12C:
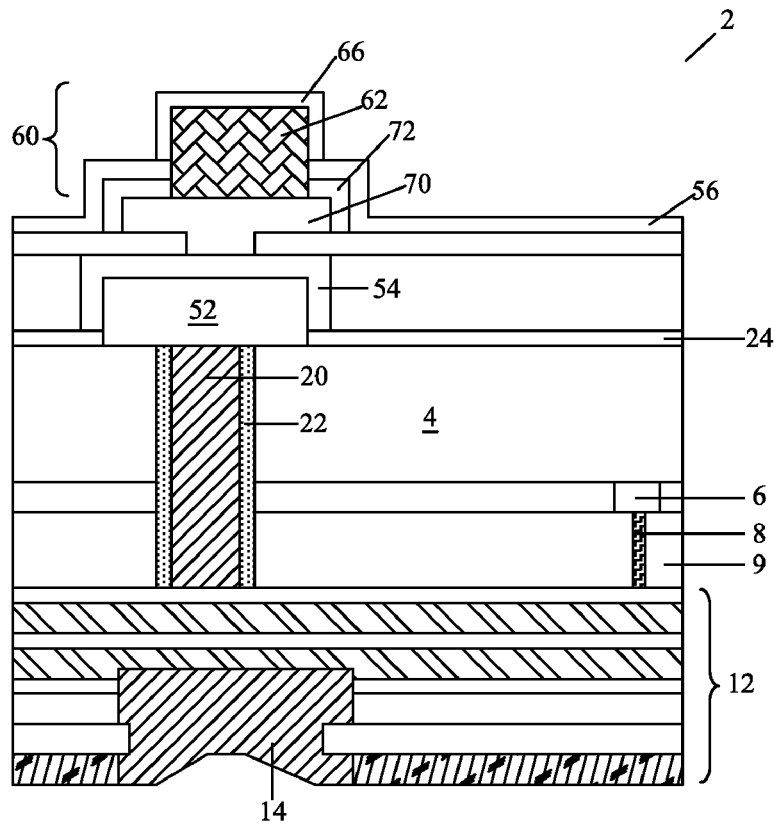

FIG. 12C illustrates that more than one layer of RDL may be formed on the backside of chip 2, for example, in addition to RDL 52, RDL 70 is also formed, wherein RDL 70 may also be formed of copper or other metallic material. If further routing is necessary, more RDL layers may be formed. At least one, and possibly more, of the RDLs 54 and 70 on the backside of chip 2 may include silicides (54 and/or 72) formed thereon, depending on the process requirements, for example, whether the subsequently formed components require oxide-containing precursors or not.

Figure 13:
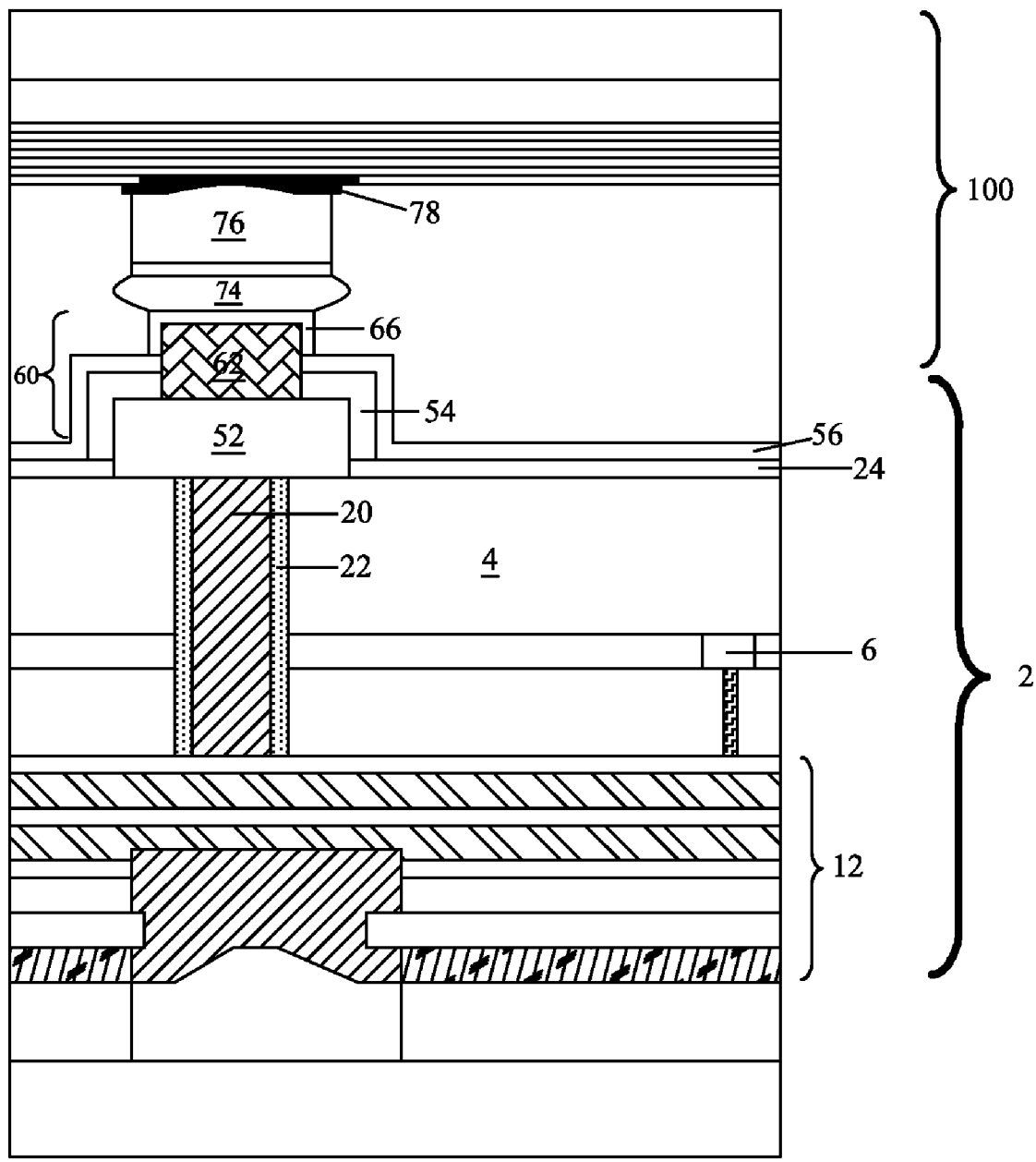
FIG. 13 illustrates a cross-sectional view of two stacked dies.

FIG. 13 illustrates the bonding of chip 2 to chip 100. In an exemplary embodiment, solder 74 is used to connect metal finish 60 of chip 2 to copper post 76, which may be formed on bond pad 78 of chip 100. It is noted that the formation of metal finish 60, which includes a thick nickel layer 62, has the function of increasing the standoff between chip 2 and chip 100.

The embodiments of the present invention have several advantageous features. By forming the silicide layer on the RDL before the formation of the passivation layer, the oxidation of the RDL is substantially eliminated. Accordingly, the bond (soldering) ability is enhanced, and the reliability of the resulting stacked die structure is improved.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps. In addition, each claim constitutes a separate embodiment, and the combination of various claims and embodiments are within the scope of the invention.

What is claimed is:

1. An integrated circuit structure comprising:
a semiconductor substrate comprising a front side and a backside;
a through-silicon via (TSV) penetrating the semiconductor substrate, the TSV comprising a back end extending to the backside of the semiconductor substrate;
a redistribution line (RDL) over the backside of the semiconductor substrate and connected to the back end of the TSV;
a silicide layer over and adjoining the RDL;
an active circuit on the front side of the semiconductor substrate, wherein the active circuit and the RDL are on opposite sides of the semiconductor substrate;
a passivation layer over the RDL; and
an opening in the passivation layer, and directly over a portion of the RDL, wherein the opening penetrates through the silicide layer, and wherein the portion of the RDL is exposed through the opening.

2. The integrated circuit structure of claim 1, wherein the RDL comprises copper, and wherein the silicide layer comprises copper silicide.

3. The integrated circuit structure of claim 1, wherein the opening is spaced apart from the RDL by the silicide layer.

4. The integrated circuit structure of claim 1 further comprising a nickel layer in the opening, and a gold layer over the nickel layer.

5. The integrated circuit structure of claim 1, wherein a sidewall of the RDL is overlapped by the opening.

6. The integrated circuit structure of claim 1, wherein the passivation layer comprises an oxide-containing dielectric material.

7. The integrated circuit structure of claim 1, wherein the silicide layer comprises a horizontal portion adjoining a top surface of the RDL, and a sidewall portion on a first sidewall of the RDL, wherein the RDL further comprises a second sidewall, with the first and the second sidewalls being opposite sidewalls, and wherein the silicide layer does not extend on the second sidewall of the RDL.

8. An integrated circuit structure comprising:
a semiconductor substrate comprising a front side and a backside;
a through-silicon via (TSV) penetrating the semiconductor substrate, the TSV comprising a back end extending beyond the backside of the semiconductor substrate;
a redistribution line (RDL) over the backside of the semiconductor substrate and connected to the back end of the TSV, wherein the RDL comprises copper;
a silicide layer over and adjoining the RDL, wherein the silicide layer comprises copper silicide;
a passivation layer over and adjoining the RDL;
an opening in the passivation layer and the silicide layer, wherein a portion of the RDL is exposed through the opening;
a metal finish in the opening and contacting the RDL; and
an active circuit on the front side of the semiconductor substrate, wherein the active circuit and the RDL are on opposite sides of the semiconductor substrate.

9. The integrated circuit structure of claim 8, wherein the passivation layer comprises an oxide-containing dielectric material.

10. The integrated circuit structure of claim 8, wherein the metal finish is in physical contact with the RDL.

11. The integrated circuit structure of claim 8, wherein the metal finish is in physical contact with the silicide layer, and is spaced apart from the RDL by the silicide layer.

12. The integrated circuit structure of claim 8, wherein the metal finish comprises a nickel layer, and a gold layer over the nickel layer.

13. The integrated circuit structure of claim 8, wherein an entirety of the metal finish is directly over the RDL.

14. The integrated circuit structure of claim 8, wherein the metal finish comprises a first portion directly over the RDL, and a second portion on a sidewall of the RDL.

15. The integrated circuit structure of claim 8, wherein the silicide layer comprises a horizontal portion adjoining a top surface of the RDL, and a sidewall portion on a first sidewall of the RDL, wherein the RDL further comprises a second sidewall, with the first and the second sidewalls being opposite sidewalls, and wherein the silicide layer does not extend on the second sidewall of the RDL.

16. The integrated circuit structure of claim 15, wherein substantially all sidewalls of the RDL are in contact with the silicide layer.

* * * * *